United States Patent [19]

Huang et al.

[11] 4,330,768

[45] May 18, 1982

[54] DISPERSION COMPENSATED ACOUSTIC SURFACE WAVEGUIDES USING DIFFUSED SUBSTRATES

[75] Inventors: Peter H. C. Huang, Alexandria, Va.; Joseph F. Weller, Oxon Hill, Md.; Thomas G. Giallorenzi, Springfield, Va.

[73] Assignee: The United States of America as represented by the Secretary of the Navy, Washington, D.C.

[21] Appl. No.: 192,962

[22] Filed: Oct. 2, 1980

[51] Int. Cl.[3] ........................ H03H 9/42; H03H 9/68; H03H 9/70; H01L 41/22

[52] U.S. Cl. .................................... 333/153; 333/195; 364/821

[58] Field of Search ................................ 333/150–155, 333/193–196; 310/313 A, 313 B, 313 C, 313 D, 313 R; 331/107 A; 330/3.5; 364/821; 350/96.1, 96.11, 96.12, 96.13, 96.14, 96.17, 96.19, 360, 361, 363

[56] References Cited

U.S. PATENT DOCUMENTS

| | | | |
|---|---|---|---|
| 3,795,879 | 3/1974 | Whitehouse et al. | 310/313 A X |
| 3,831,115 | 8/1974 | Coldren | 333/150 |
| 3,837,827 | 9/1974 | Carruthers et al. | 350/96.19 |
| 3,946,338 | 3/1976 | Schmidt | 310/313 A |
| 3,990,775 | 11/1976 | Kaminow et al. | 350/96.14 |
| 4,181,904 | 1/1980 | Weller et al. | 333/195 X |
| 4,217,564 | 8/1980 | Autra | 333/196 |

OTHER PUBLICATIONS

Parker et al., "Acoustic Surface-Wave Band-Pass Filters.

Weller et al., Surface Acoustic Waveguides on $LiNbO_3$ formed by Titanium In-Diffusion", Applied Physic Letters, vol. 31, No. 3, Aug. 1, 1977, pp. 146–148.

*Primary Examiner*—Marvin L. Nussbaum
*Attorney, Agent, or Firm*—Robert F. Beers; William T. Ellis; Kenneth E. Walden

[57] ABSTRACT

A surface acoustical wave (SAW) waveguide device which compensates for dispersion by utilizing diffused substrates. Various embodiments have in-diffused or out-diffused core regions in which the ray is channeled that are topped by a thin metallic film overlay. Partially surrounding each core region are cladding portions which are also selectively in-diffused or out-diffused and may be covered by the metal overlay. By varying the amounts of in-diffusion or out-diffusion for the particular application, the effects of dispersion are minimized.

19 Claims, 13 Drawing Figures

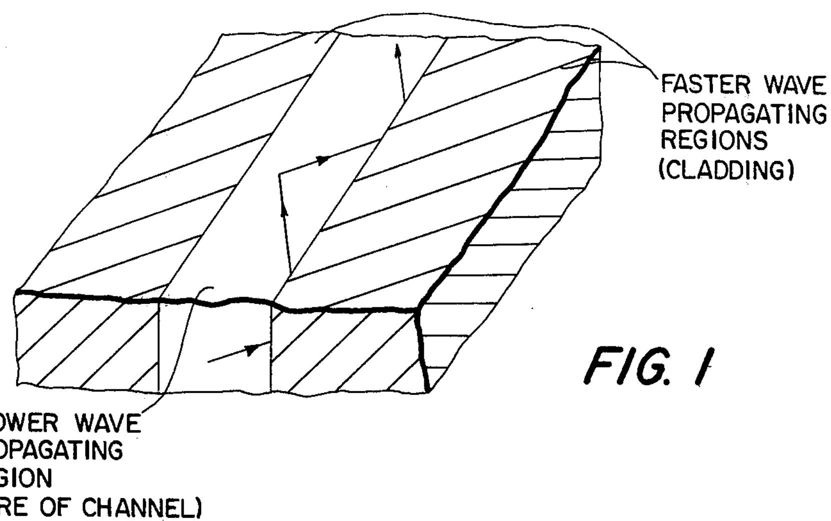
FIG. 1
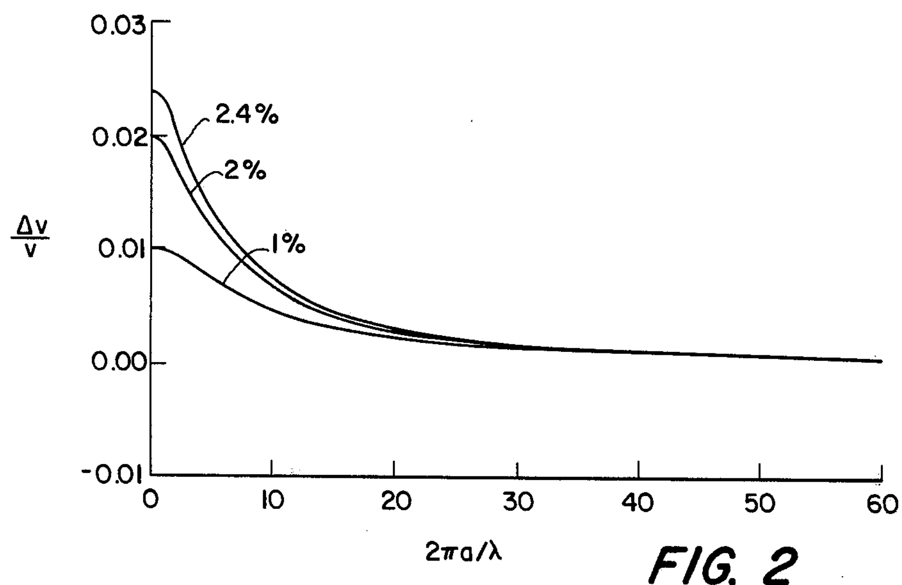
FIG. 2
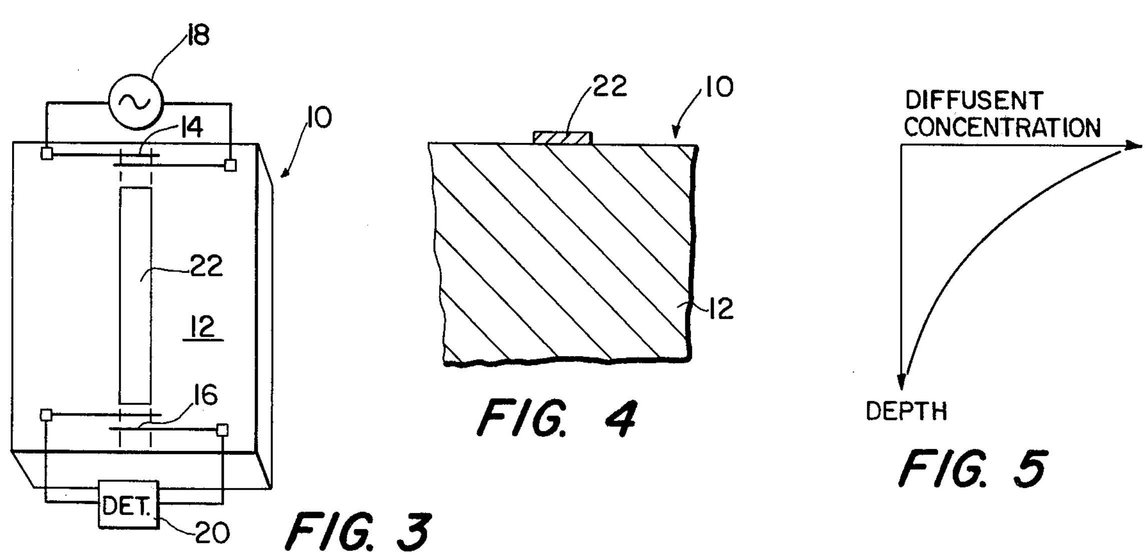
FIG. 3
FIG. 4
FIG. 5

DISPERSION COMPENSATED ACOUSTIC SURFACE WAVEGUIDES USING DIFFUSED SUBSTRATES

BACKGROUND OF THE INVENTION

The present invention relates generally to surface acoustical wave (SAW) devices and more particularly to SAW wave-guides having diffused substrates.

Surface acoustical waveguides in general are formed by confining a channeled (or core) region with a surrounding region (or cladding) having a faster wave velocity, as depicted schematically in FIG. 1. Due to the differences in physical properties, e.g. density and acoustic velocities, the wave will be restricted or channeled in the inner slower region. In FIG. 1, the faster wave propagating regions are shown by cross-hatching, while the slower central region, in which a ray is shown zigzagging back and forth by virture of the total internal reflections at the interface between the slow and fast regions, is shown without cross hatching. Various ways can be utilized to confine the SAW to an internal, channeled region. Materials having different physical properties, such as density, can be utilized so as to achieve a central region with a slower wave propagating velocity effect, or the boundary conditions can be effected to form a channeled region. One of the simplest waveguides developed in the prior art is a thin-film metal overlay that slows down the wave in the guide or channeled region. In piezoelectric crystal substrates, the thin-film metal overlay changes the boundary conditions by creating a short-circuited condition at the interface between the substrate and the overlay. Since the velocity of the wave changes accordingly, the wave is channeled beneath the overlay. SAW devices in which the slow region is created by a metal strip are referred to in the art as $\Delta v/v$ waveguides. The $\Delta v/v$ refers to the velocity difference between the cladding or surrounding region and the velocity in the core, divided by the velocity with no strip geometry at all. These $\Delta v/v$ waveguides have been used in the prior art for amplifiers, long delay lines, and signal processors such as convolvers. In both long delay lines and signal processors some limitations have been experienced due to the effect of phase dispersion, i.e., when different frequencies travel down the guide with unequal phase velocities. Dispersion relations, developed by numerous people, indicate that the effective phase velocity varies between the velocity in the slow region with no waveguides and the velocity in the fast region with no waveguides. The amount of dispersion depends on the size of the velocity changes between the cladding and the core; i.e. a large $\Delta v/v$ produces high dispersion. Shown in FIG. 2 is a graphical representation of $\Delta v/v$ plotted with respect to the waveguide width "a" multiplied by $2\pi$ and divided by $\lambda$, which is the acoustic wavelength. The three curves represent three different values of $\Delta v/v$ (evaluated when $a=0$). As can be appreciated by those skilled in the art, the dispersion or velocity differences tend to decrease for a lower $\Delta v/v$ (evaluated at $a=0$). The phase dispersion (reflected in FIG. 2 by the slope) is particularly a problem at small wavelengths when power is maximized.

One technique for dispersion compensation in SAW waveguides is mass loading of the core region. This has been suggested by Ronald A. Schmidt and Larry A. Goldren in the publication "Thin Film Acoustic Surface Waveguides on Anisotropic Media" (IEEE Transactions on Sonics and Ultrasonics, Vol. SU-22, No. 2, March, 1975) and some analysis has been performed. According to the analysis, mass loading helps in terms of group dispersion, but aids very little in phase dispersion. Furthermore, mass loading results in energy losses. Another approach has been to compensate externally using a surface wave delay equalizing filter, but that approach requires an additional device and increased circuit insertion losses.

Another type of SAW waveguide is disclosed in U.S. Pat. No. 3,946,338 to Schmidt, as well as in the publication "Acoustic Surface Wave Velocity Perturbations in $LiNbO_3$ by Diffusion of Metals" (Applied Physics Letters, Vol. 27, No. 1, July 1, 1975), also by R. V. Schmidt. Schmidt disclosed that the diffusion of metals, such as titanium, nickel and chromium into lithium niobate increases the acoustic velocity in the diffused region by a significant amount (up to a value change that is substantially more than one percent) without any readily apparent increase in acoustic loss. Furthermore, Schmidt disclosed a waveguide created by providing regions of uniformly increased acoustic wave velocity about an undiffused channel. Schmidt's device comprises a periodic pattern of grating-like regions produced by diffusing metal into the substrate. However, Schmidt did not consider the use of metal waveguides (overlays) in this configuration.

SUMMARY OF THE INVENTION

Accordingly, the present invention provides a SAW waveguide comprising a substrate with diffused regions having a metal overlay on top of the substrate so as to provide a means for dispersion compensation. The thin film metal overlay performs its function by piezoelectric shorting rather than mass loading in order to reduce phase dispersion. The preferred embodiment comprises a thin film metallic strip (e.g. preferable aluminum 1500 angstroms thick but may be in the range of 1000–2000 angstroms) disposed between input and output transducers on a lithium niobate substrate. The substrate is diffused by titanium in accordance with the $\Delta v/v$, and hence dispersion, desired. A second substrate configuration comprises an out-diffused core which is surrounded by indiffused cladding portions and is topped by a thin narrow metallic film. This configuration, which increases the $\Delta v/v$ and dispersion, is useful with substrates having a low electromechanical coupling factor, i.e., a factor, reflecting the strength of the piezoelectric quality of the efficiency of converting electric energy to elastic energy. A third substrate configuration comprises a substrate having out-diffused cladding with a metal in-diffused channel or core and a metal overlay. The amount of dispersion in general is dependent upon the diffusion conditions; i.e., temperature, diffusion time, and diffusant thickness.

OBJECTS OF THE INVENTION

It is therefore an object of this invention to provide a surface acoustical wave (SAW) waveguide device with predetermined dispersion qualities.

A further object of this invention is to provide a SAW waveguide device which can be easily and inexpensively manufactured.

Another object of this invention is to provide a SAW waveguide device wherein the $\Delta v/v$ can be regulated by controlling the diffusion conditions during the fabrication process.

Still another object of the present invention is to provide a SAW waveguide device wherein the effects of phase dispersion are minimized.

Yet another object of the present invention is to provide a SAW waveguide device wherein the amount of phase dispersion maybe controlled by diffusing the substrate of the device with metal.

Other objects and many of the attendant advantages of the present invention will be readily apparent as the invention becomes better understood by reference to the following detailed description with the appended claims, when considered in conjunction with the accompanying drawings.

BRIEF DESCRIPTION OF THE DRAWINGS

FIG. 1 is a schematic perspective view demonstrating the principles of waveguiding and showing the path of the ray.

FIG. 2 is a graphical representation showing the relationship of $\Delta v/v$ to the waveguide width divided by the wavelength.

FIG. 3 is a schematic perspective view of the preferred embodiment of the present invention.

FIG. 4 is an enlarged schematic cross-sectional representation of part of the device shown in FIG. 3.

FIG. 5 is a graphical representation of the relationship between the metallic diffusion and the depth from the surface of the substrate.

DESCRIPTION OF THE PREFERRED EMBODIMENTS

Figure 6:
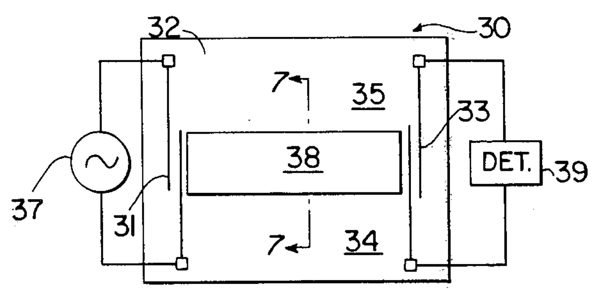
FIG. 6 is a schematic plan view of a second embodiment of the present invention.

Referring now to FIG. 3, surface acoustical wave (SAW) device 10 comprises a piezoelectric substrate 12. The embodiment shown in FIG. 3, as well as those in FIGS. 6–13, may have substrates composed of lithium tantalate, or other known piezoelectric materials. At opposite ends of substrate 12 are input and output transducers 14, 16 respectively, connected to conventional input signal means 18 and output signal detector means 20, respectively. The exact nature of the input, output means 18, 20 is dependent on the particular wave guide application and is not pertiment to the invention. Positioned on top of substrate 12, as seen in FIG. 4, is a thin metallic strip or shorting film 22. Preferably film 22 is aluminum provided with a chrome coating for increased adhesion qualities. The thickness of film 22 is preferably 1500 angstroms and generally in the range of 1000–2000 angstroms. A thin film is desirable so as to minimize mass loading and the inherent energy losses accompanying mass loading. Substrate 12 is diffused by titanium ions represented by the cross-hatch pattern in FIG. 4, FIG. 5, depicts graphically the diffusant concentration in relation to the depth in substrate 12. Generally, the depth of the wave is a wave length, e.g. 12 microns for a frequency of 300 M Hz. The diffusion process, in brief, is accomplished by evaporating a titanium film, preferably 200–1500 angstroms thick, on substrate 12 in an inert atmosphere, typically argon, at a temperature in the range of 950°–1100° C. for twelve hours. Alternately, the substrate 12 may be out-diffused, as shown in FIG. 7, so as to form a surface layer having different surface wave propagating characteristics. The selective out-diffusion of lithium oxide from a substrate of lithium niobate to form a surface guiding layer is accomplished simply by heating the substrate, usually in a vacuum, for a time period sufficient to deplete the surface region of the relatively volatile constituent. Hereinafter the results of these two processes will simply be referred to as being out-diffused or in-diffused. In FIGS. 7, 9, 11, and 13, the out-diffused portions of the substrate are indicated by reference numerals 36, 44, 45, 66, 94, and 95 while the in-diffused regions are indicated by reference numerals 34, 35, 46, 64, 65, and 96.

The following examples reveal relative comparisons, using the general configuration illustrated in FIGS. 3, 4, i.e. undivided substrate with a narrow film strip 22 which is preferably aluminum 1500 angstroms thick. In case 2 the entire substrate is out-diffused. Cases 3 and 4 are in-diffused substrates, which are diffused at a diffusion temperature of 1100° C. The measurements were taken at a wave frequency of approximately 240 megahertz.

Case No. 1: unprocessed; $\Delta v/v$ (at $a=0$)$=2.72\%$
Case No. 2: out-diffused; $\Delta v/v=2.68\%$
Case No. 3: 200 angstroms Ti-indiffused; $\Delta v/v=2.55\%$
Case No. 4: 1000 angstroms Ti-indiffused; $\Delta v/v=1.88\%$ In the case of the unprocessed substrate (Case No. 1), the $\Delta v/v$ is due to two factors: (1) the shorting of the fields at the surface by the aluminum film; and (2) mass loading due to the thickness of the film. It can be readily seen that there is little difference in regard to the $\Delta v/v$ between the unprocessed and out-diffused substrates. However, when the titanium is in-diffused (Case Nos. 3 and 4), the influence of the titanium ions introduces a third factor that decreases the $\Delta v/v$ value as the titanium ions tend to increase the SAW velocity. The amount of change in the $\Delta v/v$ depends on numerous parameters such as diffusion conditions (temperature, diffusion time, diffusant thickness) and the wavelength of the surface wave. For a particular application, in accordance with the present invention, dispersion conditions may be chosen so that the $\Delta v/v$ is minimized (to decrease dispersion) while being sufficient to create a channeled or cladded region with interface wave reflection. Naturally if the $\Delta v/v$ is reduced below a certain level the ray will not be tightly confined.

Figure 7:
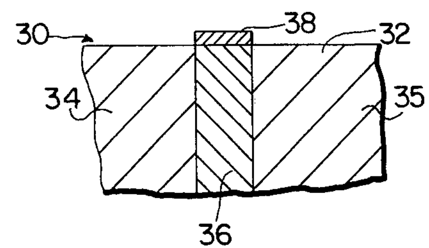
FIG. 7 is a partial cross-sectional view of the embodiment shown in FIG. 6 taken along the lines 7—7.

Referring now to FIGS. 6 and 7 there is shown a SAW waveguide device 30 comprising a substrate 32 having two indiffused outer portions 34, 35 surrounding an outdiffused inner or channel portion 36. Position directly on top of the inner portion 36 is waveguide strip 38, which can be identical to that described in association with FIGS. 3, 4, i.e. aluminum on the order to 1000–2000 angstroms in thickness. The input and output transducers 31, 33, respectively as well as the input signal means 37 and output detection means 39 are conventional and will not be described further.

Unlike the preferred embodiment shown in FIGS. 4 and 5, metal film strip 38 is positioned over an out-diffused region 36, i.e. lithium oxide has been out-diffused from the surface. The net effect of this difference in regard to the $\Delta v/v$ is computed by the following equations;

(1) v(1000 Ti-unshorted)−v(1000 Ti-shorted)=0.0188 v;

(2) v(1000 Ti-shorted)−v(out-diffused-shorted)=0.019 v

The arithmetic result is a $\Delta v/v$ of 0.0378% which is greater than the values stated above in regard to the FIGS. 4, 5 embodiment. Therefore, the effect of dispersion is increased. While this embodiment may not be useful for substrates with large coupling coefficients (i.e. the piezoelectric quality or efficiency of converting electric energy to elastic energy), such as lithium niobate, it is useful when utilizing materials with small coupling coefficients, such as quartz, where an increased $\Delta v/v$ is necessary for proper waveguiding.

Figure 8:
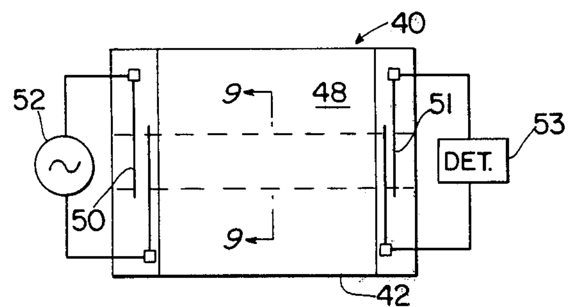
FIG. 8 is a schematic plan view of a third embodiment of the present invention.
Figure 9:
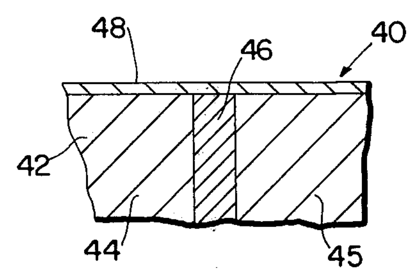
FIG. 9 is a partial cross-sectional view of the embodiment shown in FIG. 8, taken along the lines 9—9.

With reference now to the embodiment shown in FIGS. 8, 9, SAW waveguide device 40 comprising a substrate 42 having out-diffused outer or cladding portions 44, 45 which partially surround a core or channel portion 46. Positioned over portions of all three portions 44, 45, 46 is metal film or overlay 48, which is preferably aluminum on the order of 1500 angstroms in thickness. The input and output transducers 50, 51, respectively, as well as the input signal generator 52 and output signal detector 54 are conventional in nature and may vary depending upon the particular application; hence they will not be described further. While the waveguiding, which is the usual function of the metallic overlay, occurs only in the in-diffused channel region 46, the extension of overlay 48 over portion 44, 45 serves to change the overall dispersion characteristics. In general, the velocity changes ($\Delta v/v$) can be resolved in the following way:

(1A) v(out-diffused;unshorted)−v(out-diffused; shorted)=av (2A) v(in-diffused;unshorted)−v(in-diffused; shorted)=bv (3A) v(in-diffused;unshorted)−v(in-diffused;unshorted)=cv Combining; the resulting equation is:

(4A) v(indiffused; shorted)−v(out-diffused;shorted)=[a−b+c]v where the constants a, b, c are dependent upon the diffusion conditions, e.g. temperature, diffusion time, and diffusant thickness. For 1000 angstroms of titanium diffused into YZ-lithium niobate at 1100° C. for twelve hours, a=0.0268, b=0.0188, and c=0.012. Hence, $\Delta v/v=0.02$. It can be appreciated by those skilled in the art that by manipulating the appropriate values one can obtain $\Delta v/v$ and, hence, a dispersion quality, that is appropriate for the required application.

Figure 10:
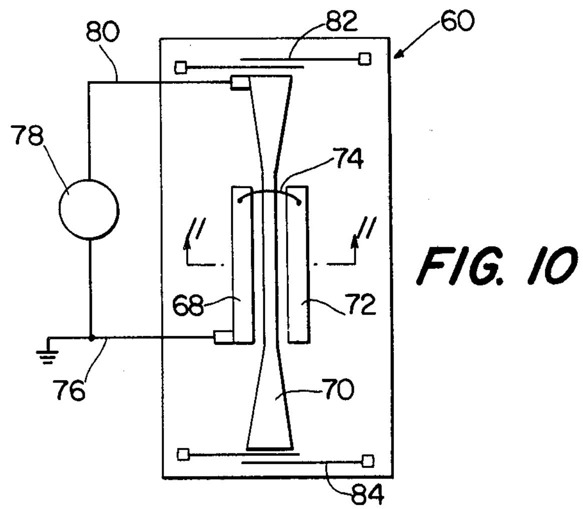
FIG. 10 is a schematic plan view of a fourth embodiment of the present invention.
Figure 11:
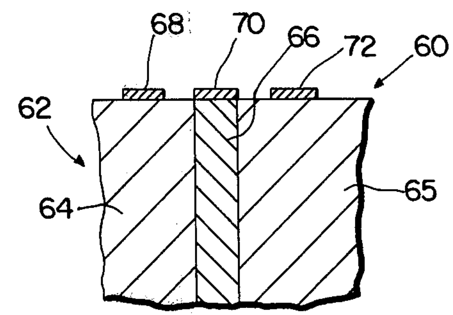
FIG. 11 is a partial cross-sectional view of the embodiment shown in FIG. 10 taken along the lines 11—11.

One application of the present invention is the menolithic convolver device 60 comprising a substrate 62 having in-diffused portion 64, 65 partially surrounding out-diffused core or channel region 66, as seen in FIG. 11. Positioned on top of substrate 62 (as shown in FIG. 11) are metallic strips 68, 70, 72. As depicted schematically in FIG. 10, strips 68, 72 are electrically interconnected by lead 74 (shown only in FIG. 10). Output lead 76 electrically connects strip 68 to the ground terminal of output receiver 78. Similarly output lead 80 connected metallic strip 70 to the opposite terminal of output means 78. Conventional input transducers 82, 84 provide means for inputting two contra-travelling waves. Due to the non-linerality in a piezoelectric substrate 62, a voltage proportional to the product of the two waves is generated, and an integrated form of this appears at the output receiver 78. Since the output voltage is proportional to the power densities of the two waves, waveguides are used to improve the operation. Two device properties are essential to the operation of the convolver device 60; these are that the dispersion is flat over the frequency range of interest and that the waveguides are to be single moded. The device 60, utilizing these concepts in the present invention is shown in FIGS. 10, 11. In this embodiment, a metal $\Delta v/v$ guide strip 70 over an out-diffused channel portion 66 serves to confine the wave and pick-up the voltage generated by the two oppositely travelling waves. Due to the decreased amount of dispersion, a larger bandwidth can be obtained. That, in turn, increases the processing gain of the device, which is the time-bandwidth product. Furthermore, since the cut-off frequency for high order modes is inversely proportional to the $\Delta v/v$ factor, higher order modes will be generated at higher frequencies than the normal uncompensated device.

Figure 12:
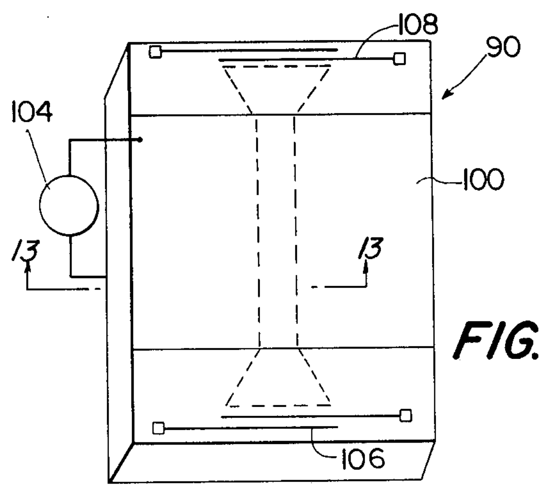
FIG. 12 is a perspective schematic plan view of a fifth embodiment of the present invention.
Figure 13:
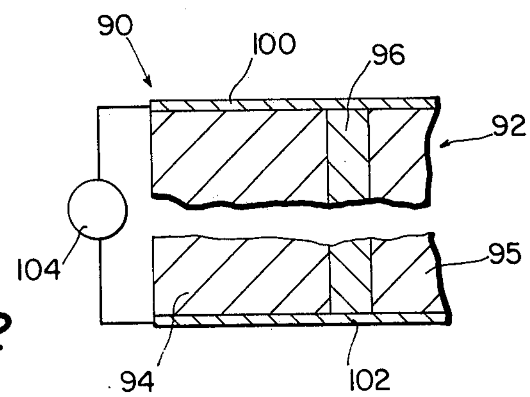
FIG. 13 is a partial cross-sectional view of the embodiment shown in FIG. 12 taken along the lines 13—13.

A modified version of the substrate configuration shown in FIGS. 8, 9 adapted to be used as a convolver is illustrated in FIGS. 12, 13. The convolver device 90 comprises a substrate 42 in FIG. 13, having out-diffused portion 94, 95 surrounding in-diffused portion 96, thereby providing a waveguide effect. Positioned on the top of substrate 92, as seen in FIG. 13, is metal overlay 100, which is preferably aluminum approximately 1500 angstroms thick but can be in the range of 1000–2000 angstroms thick. The FIGS. 12 and 13 convolver device 90 has a metallic film 102 which serves as the ground electrode. Both metal overlay 100 and ground film 102 are electrically connected (by wires or the like) to convolver output means 104, schematically shown in FIGS. 12, 13 and conventional in design. As in the embodiment illustrated in FIGS. 8, 9, input transducer 106, 108 provide means for inputting two contra-travelling waves. Likewise, the output voltage at convolver output means 104 is proportional to the power densities of the two waves. Once again, the smaller dispersion enhances the processing gain and shifts the cut-off frequency for higher order modes to higher frequencies.

Besides convolvers, the basic embodiments shown in cross-section in FIGS. 4 and 9 are desirable in long length delay lines because of their lower dispersion characteristics, since high data rate transmission is ultimately limited by dispersion. The FIGS. 4 and 9 embodiments decrease the distortion due to pulse spreading and allow higher data rates to be used. In general, the various combinations of metal overlays or strips and diffused substrates described permit the fabrication of SAW waveguides with dispersion characteristics which more appropriately suit the application. Although additional fabrication steps are necessary to make the SAW waveguide device of the present invention, the advantages over prior art $\Delta v/v$ waveguides, which could not be so selectively altered in this way, made such additional fabrication steps worthwhile.

It should be understood, of course, that the foregoing disclosure relates to only preferred embodiments of the invention and that numerous modifications or alternations may be made therein without departing from the spirit and the scope of the invention as set forth in the appended claims.

What is claimed and desired to be secured by Letters Patent of the United States is:

1. An electronic device comprising:

piezoelectric means for propagation of an elastic wave, said piezoelectric means having at least one means forming a surface over which an elastic wave is adapted to travel;

transducer means for converting an electrical signal to an elastic wave;

metallic film means in contact with said surface means for electrical interaction with an elastic wave propagated over said surface means, at least a portion of said surface means being at least partially diffused so as to effect a change in the wave propagating properties of said piezoelectric means;

whereby due to different wave propagating properties in different portions of said surface means, said wave is effectively channeled as it travels across said piezoelectric means.

2. The invention as claimed in claim 1 wherein said surface means includes a generally rectangular wave propagating portion through which said elastic wave travels as it is channeled.

3. The invention as claimed in claim 2 wherein said metallic film means has substantially linear sides and the substantially linear sides of said generally rectangular portion substantially coincide with the substantially linear sides of metallic film means.

4. The invention as claimed in claims 1 or 3 wherein at least a portion of said surface means is in-diffused by metallic ions whereby said diffusion results in a change of the wave propagating characteristics of said surface means.

5. The invention as claimed in claims 2, or 3 wherein said surface means is at least partially diffused by metallic ions in the region outside of said wave propagating rectangular portion and is not substantially diffused by metallic ions in said wave propagating rectangular portion.

6. The invention as claimed in claim 5 wherein said wave propagating rectangular portion is out-diffused.

7. The invention as claimed in claim 2, wherein said generally rectangular wave propagating portion is at least partially diffused by metallic ions and the portions of said surface means adjacent said wave propagating portion are out-diffused.

8. The invention as claimed in claim 1 wherein said metallic film means is substantially coextensive with said surface means.

9. An electronic device comprising:

piezoelectric means for propagating an elastic wave; said piezoelectric means having at least one surface over which elastic waves are adapted to be propagated;

metallic means in close proximity to said at least one surface for electrical interaction with said elastic wave;

said piezoelectric means being at least partially diffused so as to effect a change in the wave propagating properties of said piezoelectric means;

said piezoelectric means including channel means having wave propagating properties in which, in conjunction with said metallic means, said elastic wave travels slower, and cladding means surrounding said channel means having wave propagating properties which allow an elastic wave to travel faster than in said channel means;

transducer means in close proximity to said surface for conversion of an electrical input signal to an elastic wave;

whereby an elastic wave produced at said transducer means will travel substantially within said channel means.

10. The invention as claimed in claim 9 wherein said metallic means and said channel means are substantially coextensive.

11. The invention as claimed in claim 9 wherein said metallic means extends beyond said channel means and at least partially covers said cladding means.

12. The invention as claimed in claims 9 or 10 wherein said channel means is at least partially diffused by metallic ions.

13. The invention as claimed in claim 12 wherein said cladding means are out-diffused.

14. The invention as claimed in claims 9 or 10 wherein said channel means is out-diffused and said cladding means is in-diffused by metallic ions.

15. The invention as claimed in claim 14 further including ground means positioned on said cladding means, said ground means being electrically connected to a first output terminal and said metallic means being electrically connected to a second output terminal.

16. The invention as claimed in claim 15 wherein said transducer means includes two input transducers and said metallic means comprises a beam compressor whereby a signal is inputted at each of said transducers and a convoluted output signal is transmitted from said output terminals.

17. The invention as claimed in claims 9, 10, or 11 wherein said metallic means is substantially formed of aluminum.

18. The invention as claimed in claims 4 or 12 wherein said metallic ions are substantially titanium.

19. A method of fabricating a SAW waveguide device comprising the steps of:

placing a continuous metal film in the range of 200–1500 angstroms in thickness over the portions of a piezoelectric substrate which are to be in-diffused by metal ions from said metal film;

heating said piezoelectric substrate to a temperature in the range of 950°-1100° C. to allow the metal ions to be diffused into said substrate;

implacing two transducers at opposite ends of said piezoelectric substrate and covering the central region of said substrate with a thin film of substantially aluminum composition in the range of 200–1500 angstroms thick; and bonding wires to said transducers.

* * * * *